(12) United States Patent
Kikutake et al.

(10) Patent No.: US 6,671,220 B2
(45) Date of Patent: Dec. 30, 2003

(54) SEMICONDUCTOR DEVICE HAVING SIMPLIFIED INTERNAL DATA TRANSFER

(75) Inventors: Akira Kikutake, Kawasaki (JP); Satoshi Eto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/096,425

(22) Filed: Mar. 13, 2002

(65) Prior Publication Data

US 2003/0048690 A1 Mar. 13, 2003

(30) Foreign Application Priority Data

Sep. 7, 2001 (JP) ....................................... 2001-272598

(51) Int. Cl.[7] ................................................ G11C 8/00
(52) U.S. Cl. ...................... 365/233; 365/194; 365/198; 365/189.05; 327/291; 327/298; 327/299
(58) Field of Search ............................ 365/233, 230.05, 365/194, 198, 189.05; 327/291, 298, 299

(56) References Cited

U.S. PATENT DOCUMENTS

| 6,271,697 | B1 | * | 8/2001 | Hayashi et al. | ............. | 327/158 |
| 6,388,492 | B2 | * | 5/2002 | Miura et al. | ................ | 327/291 |
| 2001/0008282 | A1 | * | 7/2001 | Maeda | .......................... | 257/1 |
| 2002/0112111 | A1 | * | 8/2002 | Zabinski et al. | ............ | 710/317 |

* cited by examiner

*Primary Examiner*—Richard Elms
*Assistant Examiner*—Toan Le
(74) *Attorney, Agent, or Firm*—Arent Fox Kintner Plotkin & Kahn, PLLC

(57) ABSTRACT

A semiconductor device includes input circuits which capture respective data pieces from an exterior of the device in synchronization with respective clock signals supplied from the exterior of the device, a pulse signal generation circuit which generates a pulse signal, and drive circuits which supplies the respective data pieces captured by the input circuits to internal circuitry at a unified timing corresponding to the pulse signal.

10 Claims, 11 Drawing Sheets

SEMICONDUCTOR DEVICE HAVING SIMPLIFIED INTERNAL DATA TRANSFER

BACKGROUND OF THE INVENTION

1. Field of the Invention

The present invention generally relates to semiconductor devices, and particularly relates to a semiconductor device which receives a plurality of data pieces in synchronization with a plurality of clock signals.

2. Description of the Related Art

A semiconductor device of a synchronous type captures data supplied from an exterior of the device by latching the data in synchronization with a clock signal. In semiconductor memory devices, for example, data captured in this manner is supplied to a core circuit including memory cells and the like. Further, control signals are generated from the clock signal, and are supplied to the core circuit for the purpose of controlling the timing of operations at which the core circuit receives the data. The core circuit controls the timing of operations according to the supplied control signals, and performs operations for storing the data therein among other operations.

FIG. 1 is a block diagram of a related-art configuration of a semiconductor device such as a semiconductor memory device. FIG. 2 is a block diagram showing a configuration of a block BLK0 and a block BLK1.

As shown in FIG. 1 and FIG. 2, the block BLK0 receives a plurality of clock signals clk0, clk1, clk2, and clk3 having different timings from an exterior of the semiconductor device 10, and further receives a plurality of data signals dat0, dat1, dat2, and dat3 in synchronization with the respective clock signals. Input circuits 12 of the block BLK0 capture and latch the respective data signals in synchronization with the respective clock signals. Since the data signals dat0, dat1, dat2, and dat3 are captured in synchronization with the respective clock signals clk0, clk1, clk2, and clk3 having different timings, the transition timings of the data signals end up being different from each other.

In the block BLK0, pulse signal generation circuits 13 generate pulse signals pls0, pls1, pls2, and pls3 in synchronization with the respective clock signals clk0, clk1, clk2, and clk3. These pulse signals pls0, pls1, pls2, and pls3 have different activation timings from each other. In the block BLK0, further, drive circuits 14 transmit the latch data of the input circuits 12 to core circuits 11 at respective transmission timings based on the pulse signals pls0, pls1, pls2, and pls3. That is, data pieces DAT0, DAT1, DAT2, and DAT3 transmitted to the core circuits 11 have different transition timings.

The data pieces transmitted to the core circuits 11 need to be stored in the respective core circuits, so that the respective core circuits 11 require control signals that determine associated data acquisition timings. In order to control a plurality of data pieces DAT0, DAT1, DAT2, and DAT3 having different transition timings as in the example of FIG. 1 and FIG. 2, a plurality of control signals having corresponding timings are required. To this end, the block BLK1 receives the pulse signals pls0, pls1, pls2, and pls3 from the block BLK0, and generates the pulse signals PLS0, PLS1, PLS2, and PLS3, which are then supplied to the core circuits 11. In the example of FIG. 1, two of such blocks BLK1 are provided.

In order to generate the pulse signals PLS0, PLS1, PLS2, and PLS3, some logic operations are performed between a control signal sig and the pulse signals pls0, pls1, pls2, and pls3. This control is useful when the core circuits 11 needs to perform data acquisition operation that is dependent on the control signal sig. In order to secure a constant timing margin relative to the pulse signals pls0, pls1, pls2, and pls3 having different timings, the timing of the control signal sig needs to be shifted according to the timings of the pulse signals pls0, pls1, pls2, and pls3. To this end, delay circuits 15 of the block BLK1 receive the respective pulse signals pls0, pls1, pls2, and pls3, and delay the timing of the control signal sig according to the timing of these pulse signals, thereby generating respective control signals sig0, sig1, sig2, and sig3. Timing control signal generation circuits 16 receive the respective control signals sig0, sig1, sig2, and sig3, and carries out logic operations between these control signals and the respective pulse signals pls0, pls1, pls2, and pls3, thereby generating respective pulse signals PLS0, PLS1, PLS2, and PLS3. The pulse signals PLS0, PLS1, PLS2, and PLS3 are supplied through long-distance wires as timing control signals to the respective core circuits 11, and are used for data storage operations in the core circuits.

FIG. 3 is a timing chart showing the timing of signals described above.

In the example described above, a plurality of data pieces are input from an exterior of the device in synchronization with a plurality of clock signals having respective timings, and are transferred to the core circuits also at respective timings. This requires core circuits that are controlled to operate at the respective timings, which results in a need for a plurality of timing control signals.

When an logic operation is to be applied to the plurality of timing control signals, such a logic operation is needs to be performed in terms of each timing of the timing control signals. This results in the control signals and control circuitry becoming complex, and also results in an increase in circuit size.

Accordingly, there is a need for a semiconductor device which receives a plurality of data pieces in synchronization with respective clock signals wherein control circuitry is reduced in size and complexity by simplifying its timing control.

SUMMARY OF THE INVENTION

It is a general object of the present invention to provide a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor device according to the present invention includes input circuits which capture respective data pieces from an exterior of the device in synchronization with respective clock signals supplied from the exterior of the device, a pulse signal generation circuit which generates a pulse signal, and drive circuits which supplies the respective data pieces captured by the input circuits to internal circuitry at a unified timing corresponding to the pulse signal.

The semiconductor device described above transfers incoming data pieces within the semiconductor device at the same transfer timing after the incoming data pieces are input in synchronization with a plurality of clock signals having different timings. Because of this, the internal operation can be controlled based on a single clock signal rather than controlled based on the plurality of clock signals independently of each other. Accordingly, the control circuitry and signal wires that were necessary for each one of different timing arrangements in the related-art configuration can be reduced, thereby simplifying control and reducing circuitry size.

According to one aspect of the present invention, the pulse signal generation circuit merges the clock signals into a single clock signal, and supplies the single clock signal as the pulse signal. For example, the pulse signal generation circuit generates a signal synchronizing with one of the clock signals having the latest timing, and supplies the generated signal as the pulse signal.

According to another aspect of the present invention, the pulse signal generation circuit receives a single clock signal from the exterior of the device in addition to the clock signals, and generates the pulse signal in synchronization with the single clock signal.

According to another aspect of the present invention, the pulse signal generation circuit internally generates a single clock signal that has a timing thereof independent of the clock signals, and generates the pulse signal in synchronization with the single clock signal.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 4:
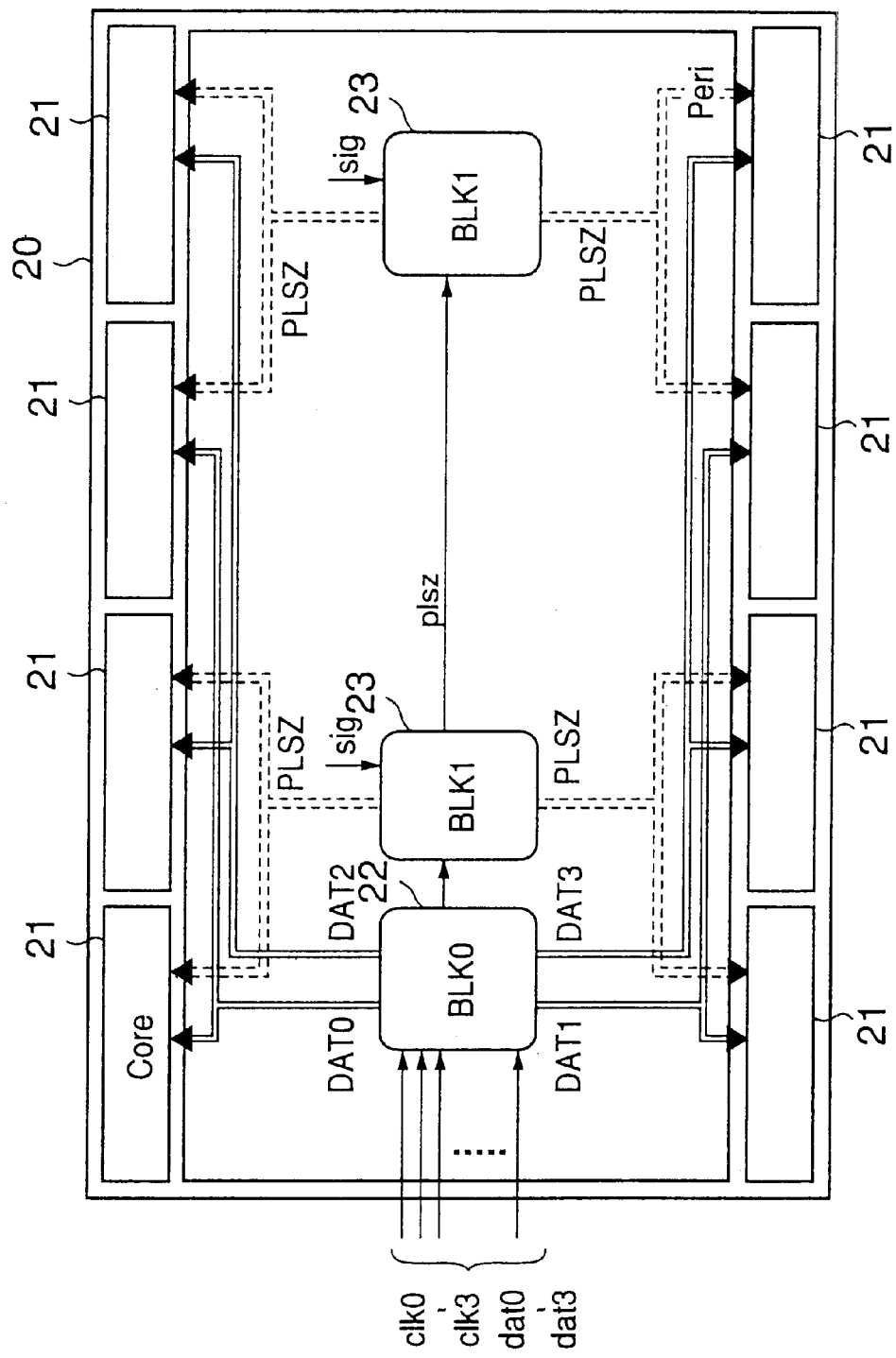
FIG. 4 is a block diagram showing a configuration of a semiconductor device such as a semiconductor memory device according to the present invention.
Figure 5:
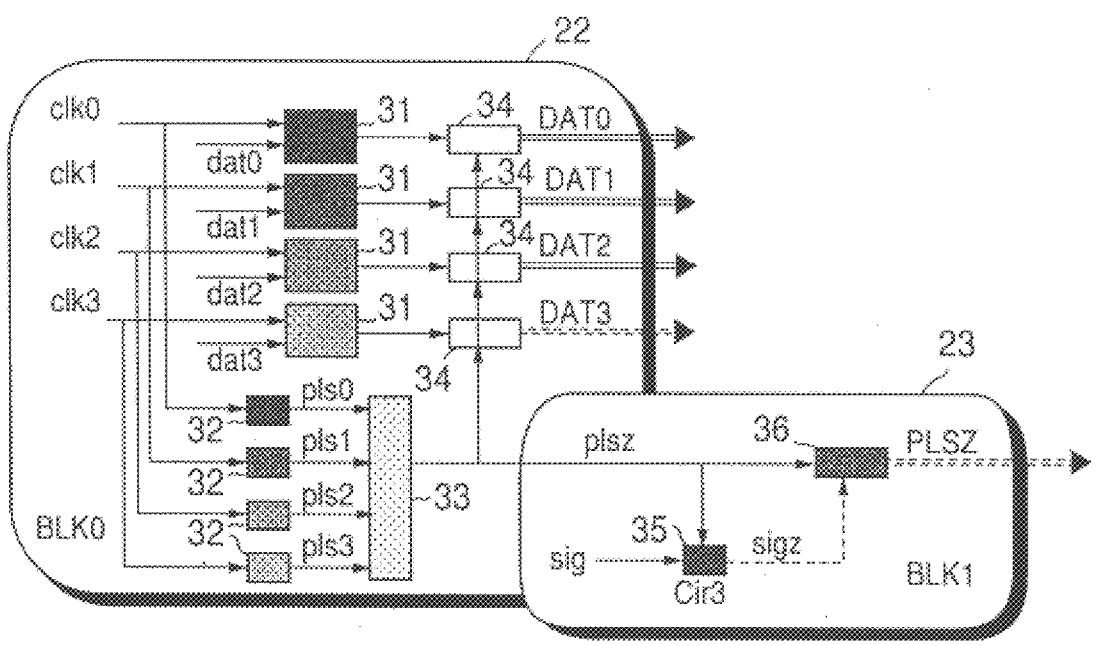
FIG. 5 is a block diagram showing a first embodiment of blocks BLK0 and BLK1 of FIG. 4.

FIG. 4 is a block diagram showing a configuration of a semiconductor device such as a semiconductor memory device according to the present invention. FIG. 5 is a block diagram showing a first embodiment of blocks BLK0 and BLK1 of FIG. 4.

As shown in FIG. 4 and FIG. 5, a block (BLK0) 22 receives a plurality of clock signals clk0, clk1, clk2, and clk3 having different timings from an exterior of the semiconductor device 20, and further receives a plurality of data signals dat0, dat1, dat2, and dat3 in synchronization with the respective clock signals.

The block 22 of FIG. 5 includes a plurality of input circuits 31, a plurality of pulse signal generation circuits 32, a merge circuit 33, and a plurality of drive circuits 34.

The input circuits 31 capture and latch the respective data signals in synchronization with the respective clock signals. Since the data signals dat0, dat1, dat2, and dat3 are captured in synchronization with the respective clock signals clk0, clk1, clk2, and clk3 having different timings, the transition timings of the data signals end up being different from each other.

The pulse signal generation circuits 32 generate pulse signals pls0, pls1, pls2, and pls3 in synchronization with the respective clock signals clk0, clk1, clk2, and clk3. These pulse signals pls0, pls1, pls2, and pls3 have different activation timings from each other.

The merge circuit 33 merges a plurality of pulse signals pls0, pls1, pls2, and pls3 to make one pulse signal, and outputs the obtained pulse signal as a pulse signal plsz. The pulse signal plsz is supplied to the drive circuits 34.

The drive circuits 34 transmit the latch data of the input circuits 31 to core circuits 21 at the transmission timing corresponding to the pulse signal plsz. That is, the data pieces DAT0, DAT1, DAT2, and DAT3 transmitted to the core circuits 21 each have the same transition timing.

Figure 1:
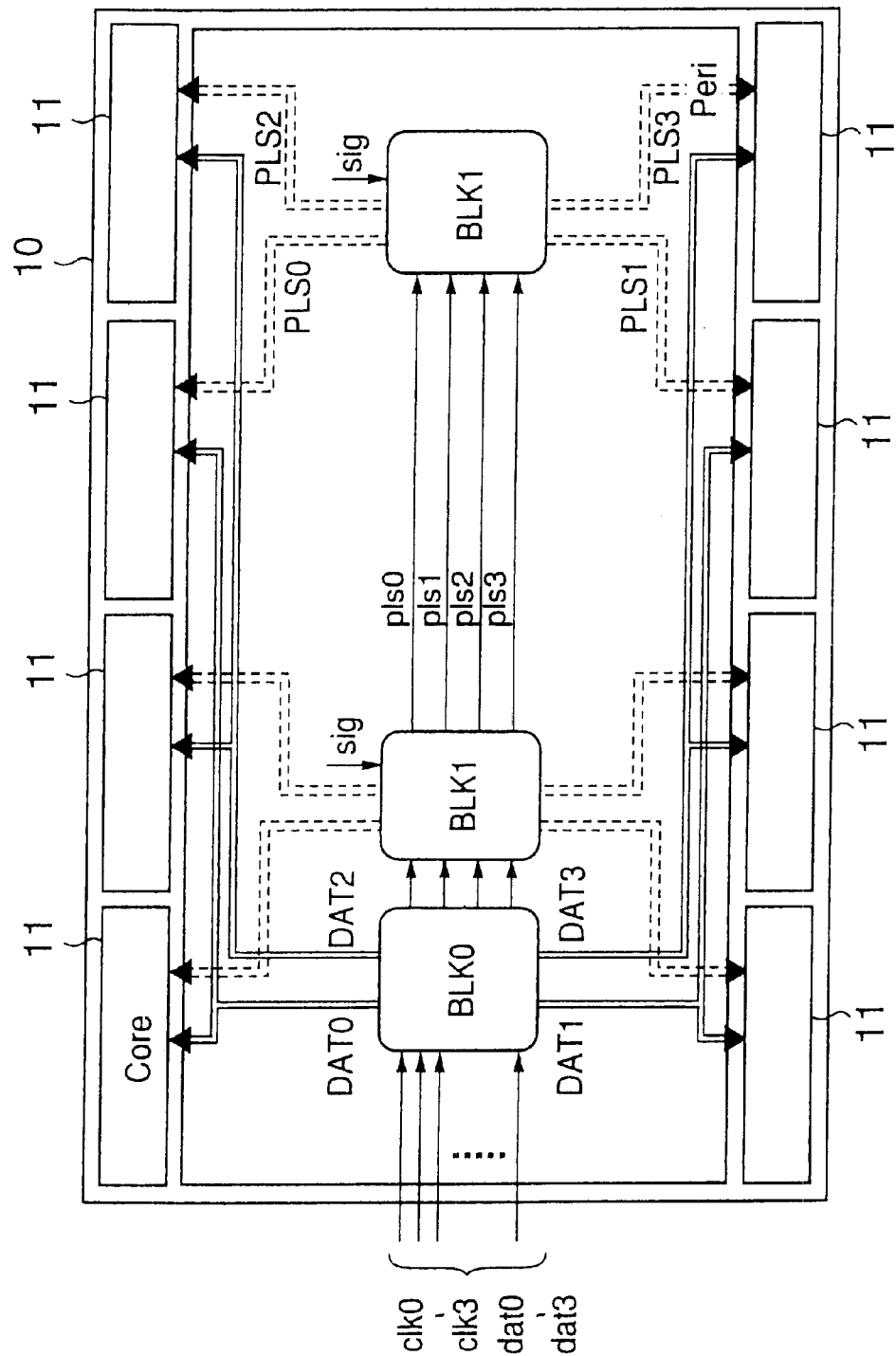
FIG. 1 is a block diagram of a related-art configuration of a semiconductor device such as a semiconductor memory device.
Figure 2:
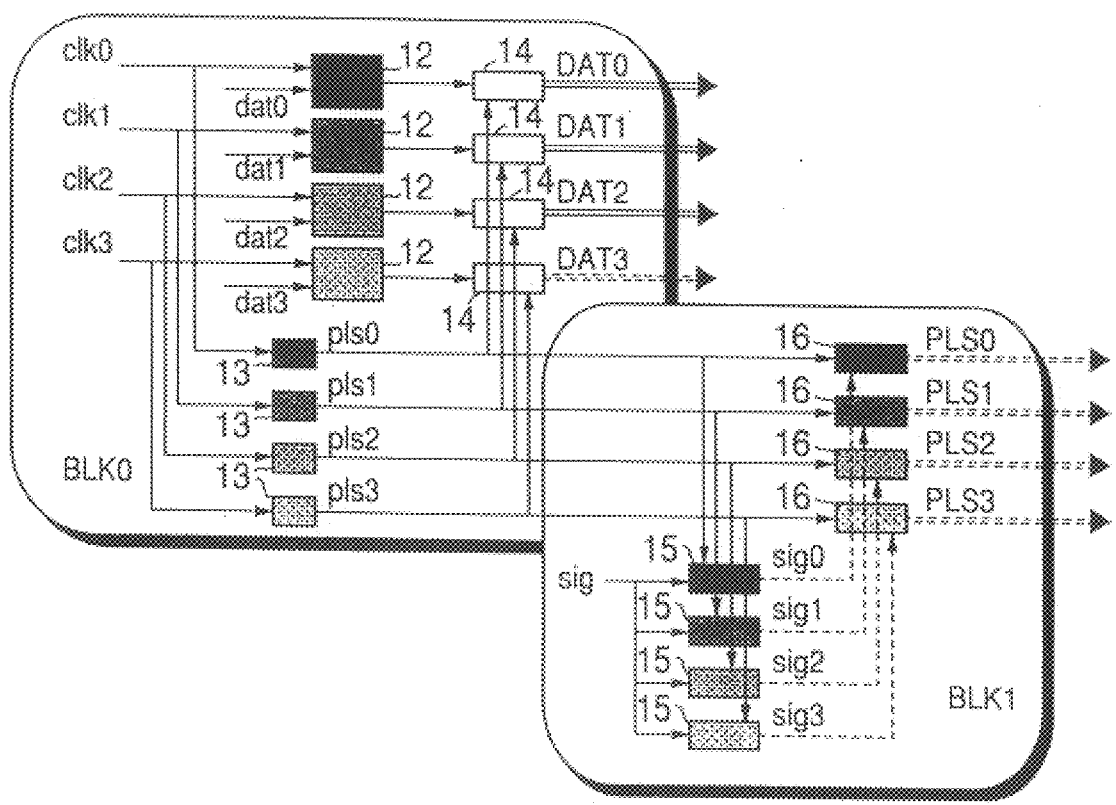
FIG. 2 is a block diagram showing a configuration of a block BLK0 and a block BLK1.
Figure 3:
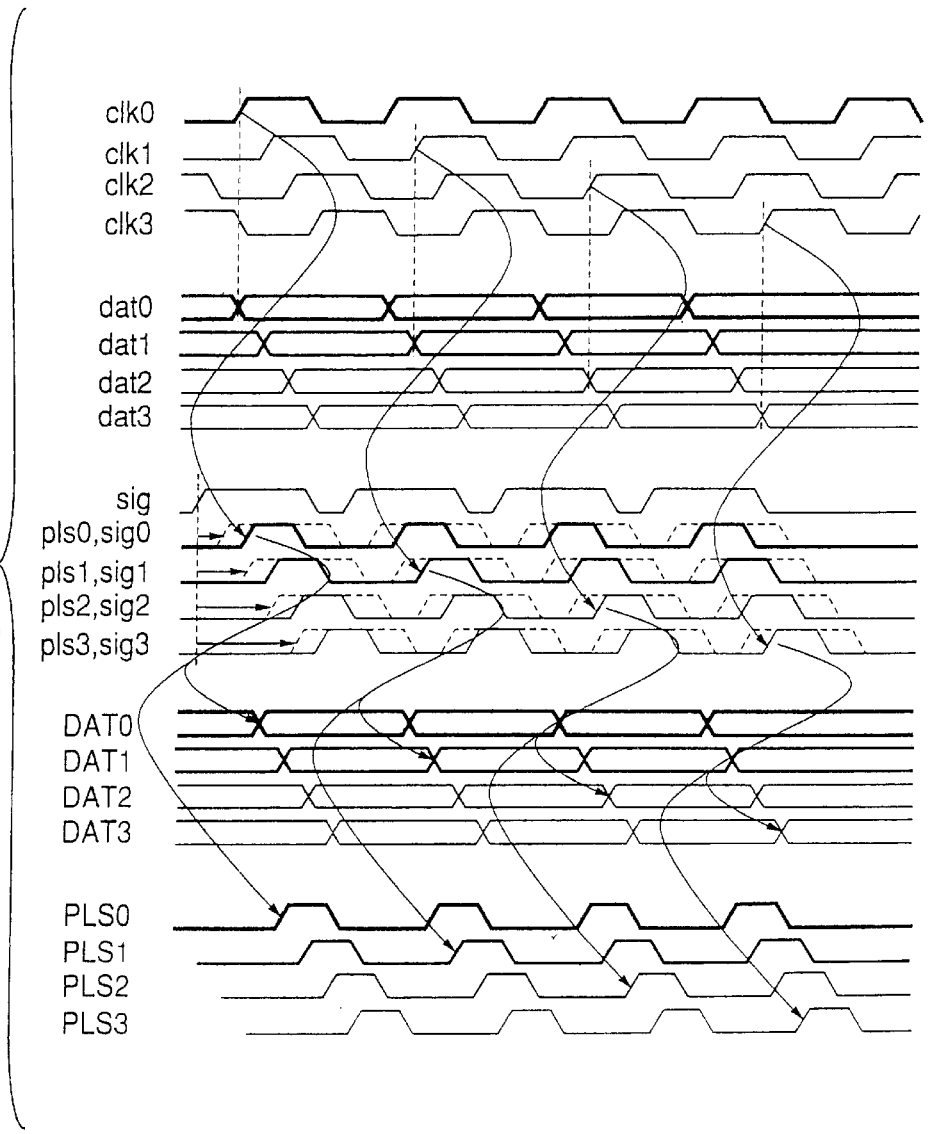
FIG. 3 is a timing chart showing the timing of signals.

The data pieces transmitted to the core circuits 21 need to be stored in the respective core circuits, so that the core circuits 21 require control signals that determine associated data acquisition timings. In the example of FIG. 1 and FIG. 2, it is necessary to control a plurality of data pieces DAT0, DAT1, DAT2, and DAT3 having different transition timings, so that a plurality of control signals having corresponding timings are required. In the configuration of FIG. 4 and FIG. 5, however, the plurality of data pieces is aligned at the same transition timing, so that only one timing control signal is necessary.

The block (BLK1) 23 includes a delay circuit 35 and a timing control signal generation circuit 36. The block 23 receives the pulse signal plsz from the block 22, and generates a pulse signal PLSZ, which is supplied to each core circuit 21. Two of such blocks BLK1 are provided in the example of FIG. 4.

The delay circuit 35 shifts the timing of the control signal sig according to the pulse signal plsz in order to secure a predetermined timing margin relative to the pulse signal plsz. That is, the delay circuit 35 receives the pulse signal plsz, and delays the timing of the control signal sig according to the timing of the pulse signal plsz, thereby generating the control signal sigz. The timing control signal generation circuit 36 receives the control signal sigz, and performs a logic operating between this control signal and the pulse signal plsz to generate a pulse signal PLSZ. This pulse signal PLSZ is supplied through long-distance wires as a timing control signal to each core circuit 21, and is used for data storage operation in the core circuit.

Figure 6:
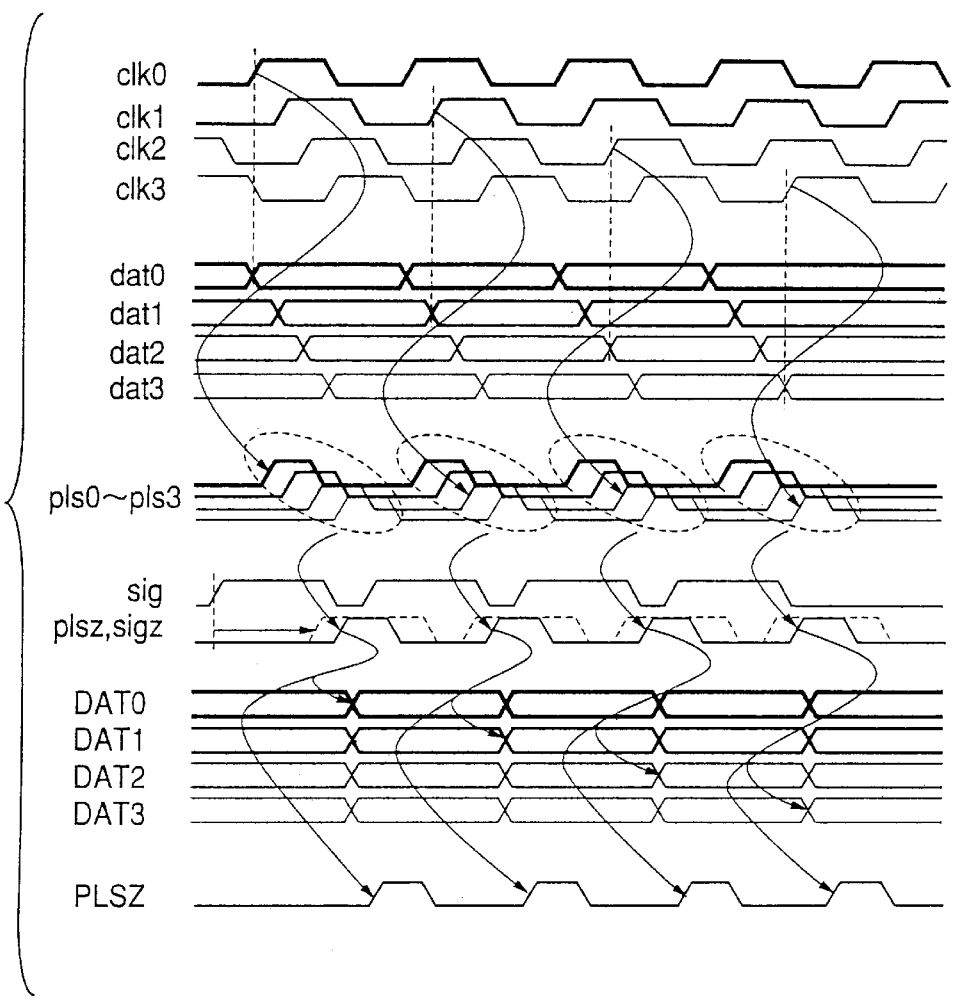
FIG. 6 is a timing chart showing the timing of signals.

FIG. 6 is a timing chart showing the timing of signals described above. As shown in FIG. 6, the pulse signals pls0, pls1, pls2, and pls3 are merged to generate the pulse signal plsz. Based on the pulse signal plsz, the timing of the control signal sig is delayed to generate the control signal sigz. Then, a logic operation is performed between the control signal sigz and the pulse signal plsz, thereby generating the pulse signal PLSZ.

In this manner, the semiconductor device according to the present invention transfers incoming data pieces to the core of the semiconductor device at the same transfer timing after the incoming data pieces are input in synchronization with a plurality of clock signals having different timings. Because of this, the internal operation can be controlled based on a single clock signal rather than controlled based on the plurality of clock signals independently of each other. Accordingly, the control circuitry and signal wires that were necessary for each one of different timing arrangements in the related-art configuration can be reduced, thereby simplifying control and reducing circuitry size.

Figure 7:
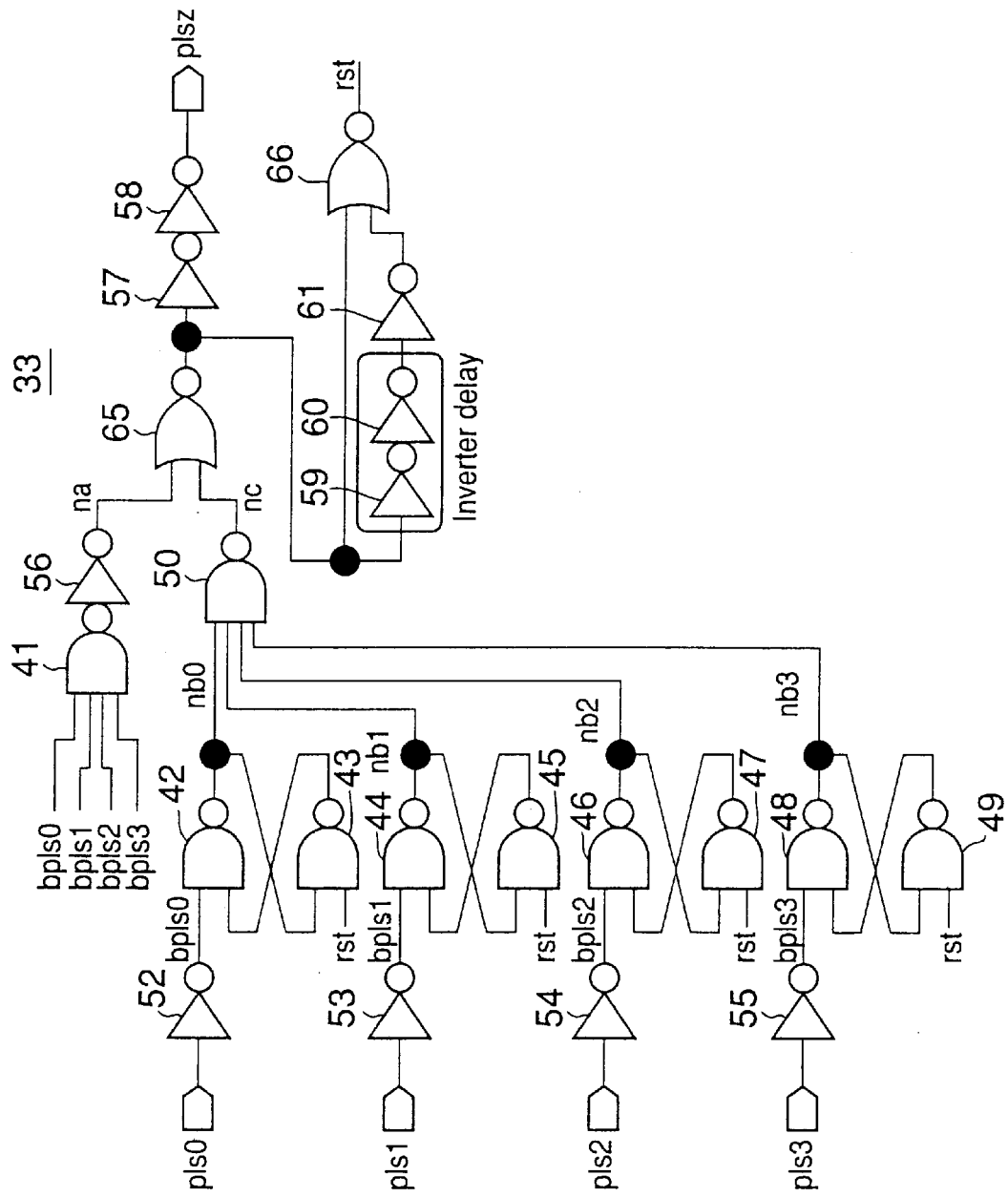
FIG. 7 is a circuit diagram showing a circuit configuration of a merge circuit.
Figure 8:
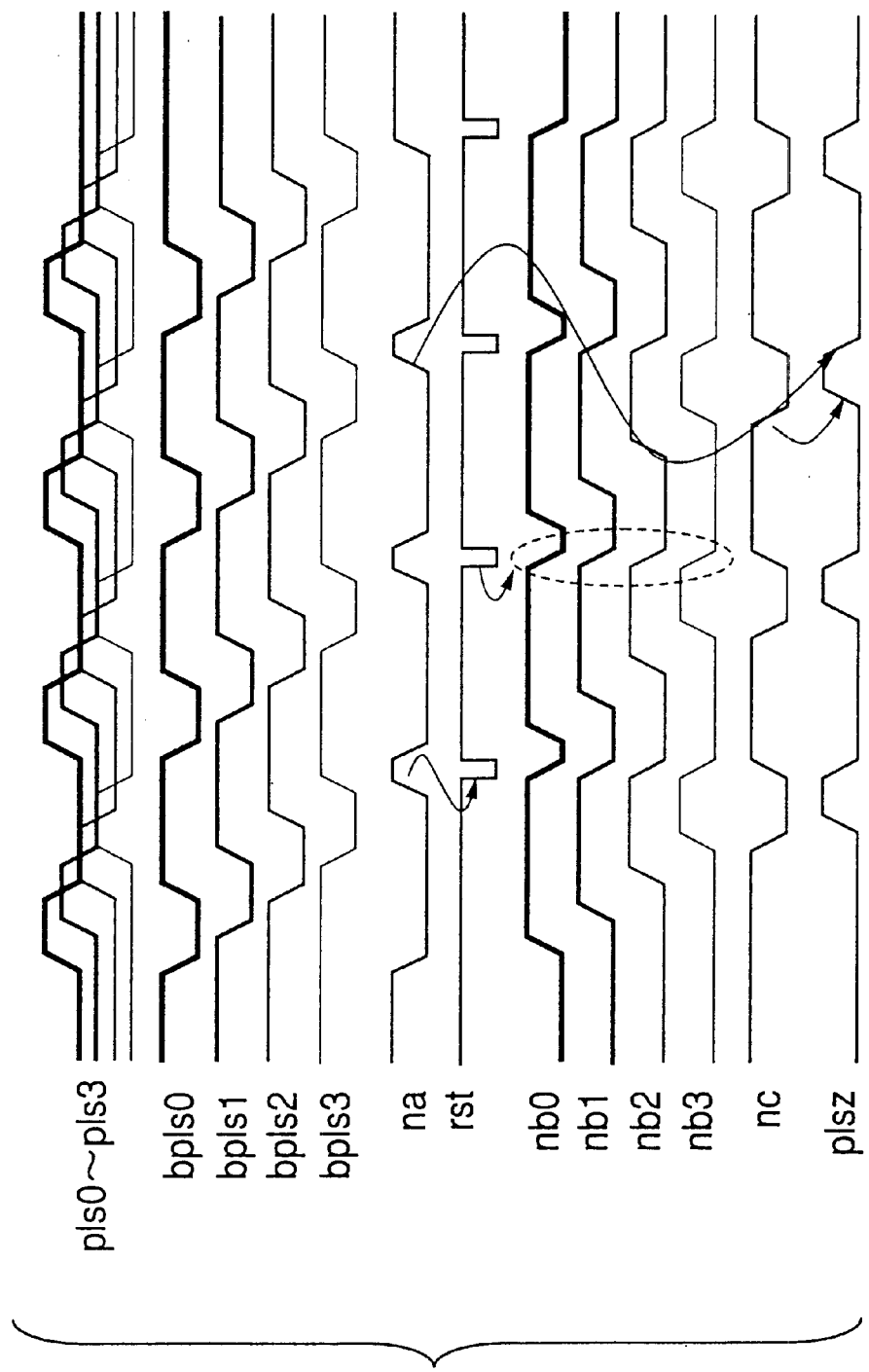
FIG. 8 is a signal timing chart for explaining the operation of the merge circuit shown in FIG. 7.

FIG. 7 is a circuit diagram showing a circuit configuration of the merge circuit 33. FIG. 8 is a signal timing chart for explaining the operation of the merge circuit 33 shown in FIG. 7.

The merge circuit 33 of FIG. 7 includes NAND circuits 41 through 50, inverters 52 through 61, and NOR circuits 65 and 66. The NAND circuits 42 and 43 together form a latch. In this latch, a signal bpls0 at the latch input node becomes LOW when the pulse signal pls0 is set to HIGH, resulting in the latch output nb0 being set to HIGH. The state in which the latch output nb0 is HIGH will be reset when the reset signal rst is changed to LOW. This operation is the same for other latches that include a latch formed by the NAND circuits 44 and 45, a latch formed by the NAND circuits 46 and 47, and a latch formed by the NAND circuits 48 and 49. Accordingly, when all the pulse signals pls0 through pls3 arrive as HIGH pulses, all the latches are set, and the output signal nc of the NAND circuit 50 will be set to LOW.

A signal bpls3 that is an inverse of the last pulse to arrive (i.e., pls3 in the example of FIG. 8) is already LOW when Signal nc changes to LOW. As a result, the output na of the inverter 56 that is equivalent to an AND value between the signals bpls0 through bpls3 is placed in the LOW state. In response to the change to LOW of the signal nc, thus, the output of the NOR circuit 65 changes to HIGH, resulting in the output plsz of the merge circuit 33 being set to HIGH.

When the last pulse to arrive (i.e., pls3 in the example of FIG. 8) returns to LOW, all the signals bpls0 through bpls3 are HIGH, so that the output na of the inverter 56 will be set to HIGH. In response, the output of the NOR circuit 65 returns to LOW, resulting in the output plsz of the merge circuit 33 returning to LOW.

Moreover, when the output of the NOR circuit 65 changes to LOW as described above, the output of the NOR circuit 66 is changed to HIGH. As a result, the reset signal rst is set to HIGH for the duration that corresponds to a delay time of the series of delay elements comprised of the inverters 59 through 61. This reset signal rst resets all the latches, thereby returning the latch outputs nb0 through nb3 to LOW.

In this manner, when all the pulse signals pls0 through pls3 arrive, the merge circuit 33 that is configured and operates as shown in FIG. 7 and FIG. 8 outputs the pulse signal plsz staying at the HIGH level only for the predetermined time period. That is, the pulse signal plsz is output at the timing that is aligned to the last pulse to arrive among all the pulse signals pls0 through pls3. In this manner, a merge operation is achieved that merges a plurality of pulse signals at the timing corresponding to the timing of the last pulse signal to arrive.

Figure 9:
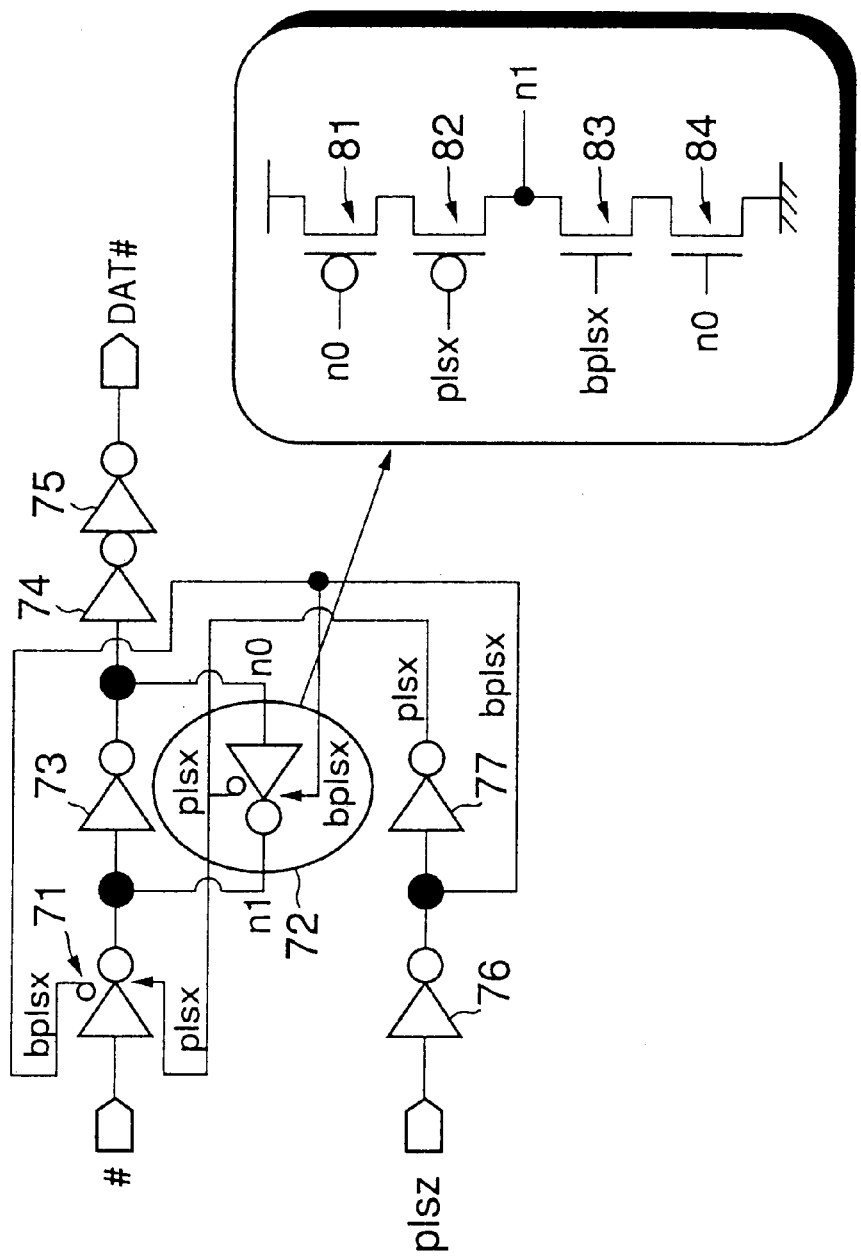
FIG. 9 is a circuit diagram showing a circuit configuration of a drive circuit shown in FIG. 5.

FIG. 9 is a circuit diagram showing the circuit configuration of one of the drive circuits 34 of FIG. 5. This drive circuit 34 transmits the data signal supplied from the corresponding input circuit 31 to the core circuit 21 at the timing of the pulse signal plsz supplied from the merge circuit 33. Here, the input circuit 31 is of an ordinary type used for synchronous data capture in semiconductor devices, and a description of configuration thereof will be omitted.

The drive circuit 34 of FIG. 9 includes gated inverters 71 and 72 and inverters 73 through 77. As shown in an enlarged diagram, the gated inverter 72 includes PMOS transistors 81 and 82 and NMOS transistors 83 and 84. On top of the ordinary inverter (i.e., the set of the PMOS transistor 81 and the NMOS transistor 84), the gated inverter 72 has an additional set of the PMOS transistor 82 and the NMOS transistor 83 to provide an additional gate function. When a signal plsx is LOW and a signal bplsx is HIGH, the gate opens to let the inverter function. It should be noted that the configuration of the gated inverter 71 is opposite to the configuration of the gated inverter 72 in that the gate opens to allow the inverter to function when the signal plsx is HIGH and the signal bplsx is LOW.

When the pulse signal plsz from the merge circuit 33 changes to HIGH, signals plsx and bplsx become HIGH and LOW, respectively, so that the gated inverter 71 functions as an inverter. In this case, therefore, data data# (#=0, 1, 2, 3) supplied from the input circuit 31 propagates through the inverter series, followed by being output from the drive circuit 34 as data DAT#. When the pulse signal plsz thereafter returns to LOW, the gated inverter 72 functions as an inverter, thereby holding data in a latch that the gated inverter 72 forms with the inverter 73. As a result, the drive circuit 34 maintains the same data output until the next pulse signal plsz arrives.

In this manner, the drive circuit 34 transmits the data from the input circuit 31 to the core circuit 21 at the timing at which the pulse signal plsz becomes HIGH, and maintains the output thereof until the pulse signal plsz is set to HIGH again.

Figure 10:
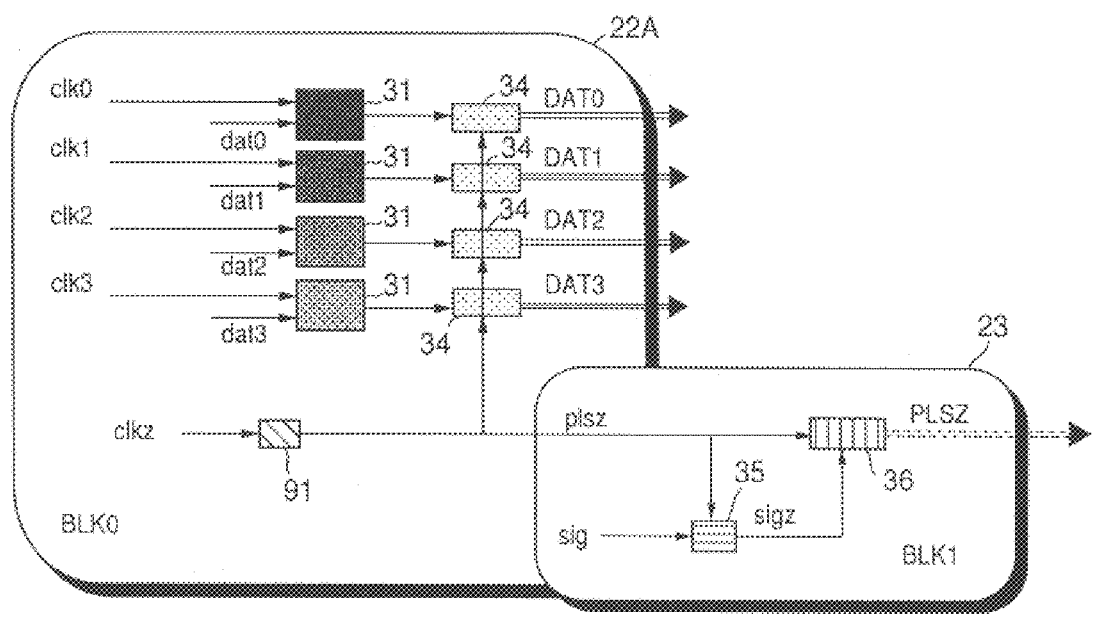
FIG. 10 is a drawing showing a second embodiment of the blocks of the semiconductor device according to the present invention.

FIG. 10 is a drawing showing a second embodiment of the blocks of the semiconductor device according to the present invention. In FIG. 10, the same elements as shown in FIG. 5 are referred to by the same numerals.

A block 22A of FIG. 10 includes the plurality of input circuits 31, the plurality of drive circuits 34, and a pulse signal generation circuit 91.

The block 22A of FIG. 10 receives a plurality of clock signals clk0, clk1, clk2, and clk3 having different timings from an exterior of the semiconductor device, and further receives a plurality of data signals dat0, dat1, dat2, and dat3 in synchronization with the respective clock signals. Also, the block 22A receives a clock signal clkz from the exterior of the semiconductor device.

The input circuits 31 capture and latch the respective data signals in synchronization with the respective clock signals. The pulse signal generation circuit 91 generates a pulse signal plsz in synchronization with the clock signal clkz. The generated pulse signal plsz is supplied to the drive circuits 34.

The drive circuits 34 transmit the latch data of the input circuits 31 to the core circuits 21 (see FIG. 4) at the transmission timing corresponding to the pulse signal plsz. That is, the data pieces DAT0, DAT1, DAT2, and DAT3 transmitted to the core circuits 21 each have the same transition timing.

The block 23 has the same configuration as that of FIG. 5. The block 23 receives the pulse signal plsz from the block 22A, and generates the pulse signal PLSZ that is supplied to the core circuits 21.

In this manner, the semiconductor device according to the present invention transfers incoming data pieces to the core of the semiconductor device at the timing corresponding to a clock signal supplied from an exterior of the device after the incoming data pieces are input in synchronization with a plurality of clock signals having different timings. Because of this, the internal operation can be controlled based on the single clock signal rather than controlled based on the plurality of clock signals independently of each other. Accordingly, the control circuitry and signal wires that were necessary for each one of different timing arrangements in the related-art configuration can be reduced, thereby simplifying control and reducing circuitry size.

Figure 11:
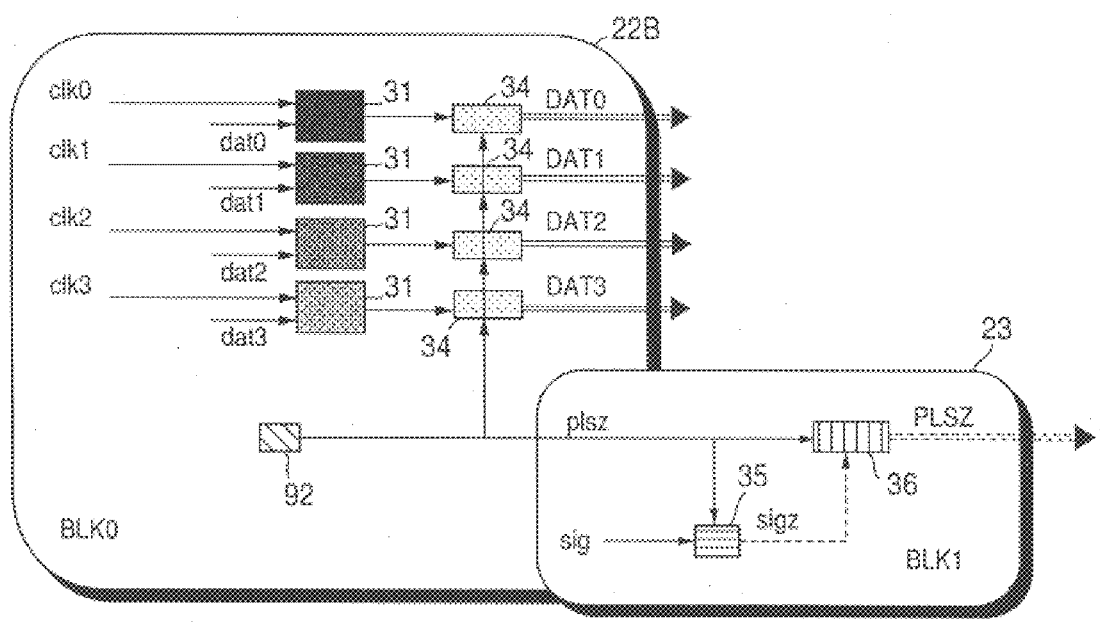
FIG. 11 is a drawing showing a third embodiment of the blocks of the semiconductor device according to the present invention.

FIG. 11 is a drawing showing a third embodiment of the blocks of the semiconductor device according to the present invention. In FIG. 11, the same elements as shown in FIG. 5 are referred to by the same numerals.

A block 22B of FIG. 11 includes the plurality of input circuits 31, the plurality of drive circuits 34, and a pulse signal generation circuit 92.

The block 22B of FIG. 11 receives a plurality of clock signals clk0, clk1, clk2, and clk3 having different timings from an exterior of the semiconductor device, and further receives a plurality of data signals dat0, dat1, dat2, and dat3 in synchronization with the respective clock signals.

The input circuits 31 capture and latch the respective data signals in synchronization with the respective clock signals.

The pulse signal generation circuit 92 does not operate in synchronization with a clock signal supplied from an exterior, but generates a pulse signal plsz on its own that is not in synchronization with an external clock signal. This is done by use of an oscillator function or the like. The generated pulse signal plsz is supplied to the drive circuits 34.

The drive circuits 34 transmit the latch data of the input circuits 31 to the core circuits 21 (see FIG. 4) at the transmission timing corresponding to the pulse signal plsz that is not in synchronism with an external clock signal. That is, the data pieces DAT0, DAT1, DAT2, and DAT3 transmitted to the core circuits 21 each have the same transition timing. The block 23 has the same configuration as that of FIG. 5. The block 23 receives the pulse signal plsz from the block 22B, and generates the pulse signal PLSZ that is supplied to the core circuits 21.

In this manner, the semiconductor device according to the present invention transfers incoming data pieces to the core of the semiconductor device at the timing corresponding to a pulse signal that is independent of any external clock signal after the incoming data pieces are input in synchronization with a plurality of clock signals having different timings. Because of this, the internal operation can be controlled based on a single clock signal rather than controlled based on the plurality of clock signals independently of each other. Accordingly, the control circuitry and signal wires that were necessary for each one of different timing arrangements in the related-art configuration can be reduced, thereby simplifying control and reducing circuitry size.

In the embodiments described above, the plurality of data signals are input in synchronization with the respective clock signals. The clock signals referred to in this context can be data strobe signals that are supplied to the semiconductor memory devices. Further, the data signals can be any signals that represent information supplied to the semiconductor device, and may include address signals, control signals, command signals, or the like of the semiconductor memory devices.

Further, the present invention is not limited to these embodiments, but various variations and modifications may be made without departing from the scope of the present invention.

The present application is based on Japanese priority application No. 2001-272598 filed on Sep. 7, 2001, with the Japanese Patent Office, the entire contents of which are hereby incorporated by reference.

What is claimed is:

1. A semiconductor device, comprising:
    input circuits which capture respective data pieces from an exterior of the device in synchronization with respective clock signals supplied from the exterior of the device;
    a pulse signal generation circuit which generates a pulse signal; and
    drive circuits which supplies the respective data pieces captured by said input circuits to internal circuitry at a unified timing corresponding to the pulse signal.

2. The semiconductor device as claimed in claim 1, further comprising:
    a delay circuit which receives a control signal from the exterior of the device and the pulse signal, and delays the control signal in conformity with the timing of the pulse signal; and
    a timing control signal generation circuit which generates a timing control signal by performing a logic operation between the pulse signal and the delayed control signal supplied from said delay circuit.

3. The semiconductor device as claimed in claim 1, wherein said pulse signal generation circuit merges the clock signals into a single clock signal, and supplies the single clock signal as said pulse signal.

4. The semiconductor device as claimed in claim 3, wherein said pulse signal generation circuit generates a signal synchronizing with one of the clock signals having a latest timing, and supplies the generated signal as said pulse signal.

5. The semiconductor device as claimed in claim 4, wherein said pulse signal generation circuit includes a plurality of latch circuits that correspond to the respective clock signals, and are set in synchronization with a pulse of the respective clock signals, and generates the signal synchronizing with one of the clock signals having the latest timing by detecting a timing at which all said latch circuits are set.

6. The semiconductor device as claimed in claim 1, wherein the pulse signal generation circuit receives a single clock signal from the exterior of the device in addition to the clock signals, and generates said pulse signal in synchronization with the single clock signal.

7. The semiconductor device as claimed in claim 1, wherein the pulse signal generation circuit internally generates a single clock signal that has a timing thereof independent of the clock signals, and generates said pulse signal in synchronization with the single clock signal.

8. A method of transferring data, comprising the steps of:
    capturing data pieces from an exterior of a semiconductor device in synchronization with respective clock signals supplied from the exterior of the semiconductor device;
    generating a pulse signal; and
    transferring the captured data pieces within the semiconductor device at a unified timing corresponding to the pulse signal.

9. The method as claimed in claim 8, further comprising the steps of:

receiving a control signal from the exterior of the semiconductor device;

delaying the control signal in conformity with the timing of the pulse signal; and generating a timing control signal by performing a logic operation between the pulse signal and the delayed control signal, the timing control signal being sent to a destination to which the captured data pieces are transferred.

10. The method as claimed in claim 8, wherein said step of generating the pulse signal merges the clock signals into a single clock signal, and supplies the single clock signal as said pulse signal.

* * * * *